US008390351B2

United States Patent
Choi et al.

(10) Patent No.: US 8,390,351 B2
(45) Date of Patent: Mar. 5, 2013

(54) DELAY LOCKED LOOP CIRCUIT OF SEMICONDUCTOR MEMORY APPARATUS

(75) Inventors: Hoon Choi, Ichon-shi (KR); Hyun Woo Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 121 days.

(21) Appl. No.: 12/971,813

(22) Filed: Dec. 17, 2010

(65) Prior Publication Data

US 2012/0081160 A1 Apr. 5, 2012

(30) Foreign Application Priority Data

Sep. 30, 2010 (KR) .................... 10-2010-0095690

(51) Int. Cl.
*H03L 7/06* (2006.01)
(52) U.S. Cl. .................. 327/158; 327/149; 327/162
(58) Field of Classification Search .................. 327/141, 327/144–163; 331/1/A, 15–17; 375/373–376
See application file for complete search history.

(56) References Cited

U.S. PATENT DOCUMENTS

| 5,614,855 | A | 3/1997 | Lee et al. | |
|---|---|---|---|---|
| 7,830,187 | B2 * | 11/2010 | Chung et al. | 327/158 |
| 2007/0176657 | A1 | 8/2007 | Byun et al. | |
| 2009/0045856 | A1 | 2/2009 | Spirkl et al. | |
| 2009/0115471 | A1 * | 5/2009 | Choi | 327/149 |
| 2010/0156489 | A1 | 6/2010 | Miyano | |
| 2010/0164566 | A1 * | 7/2010 | Ku | 327/149 |
| 2010/0321076 | A1 * | 12/2010 | Bae et al. | 327/158 |
| 2011/0102039 | A1 * | 5/2011 | Shin | 327/175 |
| 2011/0210773 | A1 * | 9/2011 | Chung | 327/158 |

FOREIGN PATENT DOCUMENTS

| JP | 2010-154019 | 7/2010 |
|---|---|---|
| KR | 1020100027267 A | 3/2010 |
| KR | 1020100048503 A | 5/2010 |

OTHER PUBLICATIONS

Won-Joo Yun et al., "A 0.1-TO-1.5GHz 4.2mW All-Digital DLL with Dual Duty-Cycle Correction Circuit and Update Gear Circuit for DRAM in 66nm CMOS Technology", 2008 IEEE International Solid-State Circuits Conference, ISSCC 2008 / Session 14 / Embedded & Graphics DRAMs / 14.7, Digest of Technical Papers, Feb. 5, 2008, pp. 282-283, 613.

* cited by examiner

*Primary Examiner* — Lincoln Donovan
*Assistant Examiner* — Brandon S Cole
(74) *Attorney, Agent, or Firm* — William Park & Associates Ltd.

(57) ABSTRACT

Various embodiments of a delay locked loop circuit of a semiconductor memory apparatus are disclosed. In one exemplary embodiment, the delay locked loop circuit may include an input correction unit configured to correct a duty ratio of an input clock based on a duty control signal and generate a reference clock; a delay line configured to delay the reference clock by a delay time and generate a delay locked clock; an output correction unit configured to correct a duty ratio of the delay locked clock based on the duty control signal and generate a corrected clock; and a control signal generation unit configured to generate the duty control signal when a correction activation signal is enabled.

26 Claims, 5 Drawing Sheets

DELAY LOCKED LOOP CIRCUIT OF SEMICONDUCTOR MEMORY APPARATUS

CROSS-REFERENCE TO RELATED APPLICATION

The present application claims priority under 35 U.S.C. §119(a) to Korean Patent Application No. 10-2010-0095690, filed on Sep. 30, 2010, in the Korean Intellectual Property Office, which is incorporated herein by reference in its entirety as if set forth in full.

BACKGROUND

1. Technical Field

Various embodiments of the invention relate to a semiconductor integrated circuit and, more particularly, to a delay locked loop (DLL) circuit of a semiconductor memory apparatus.

2. Related Art

In general, a synchronous semiconductor memory apparatus operates by receiving a clock inputted from outside. When an internal circuit of the semiconductor memory apparatus operates by receiving the clock, delay occurs in the clock. For example, delay may occur in an input clock buffer, a line loading, a data output buffer, and other circuits and lines through which the clock passes, such as logic circuits. Such delay may cause phase difference between the clock inputted externally and a clock used internally.

A DLL circuit corrects the internal delay amount of the semiconductor memory apparatus so that the clock inputted from outside of the semiconductor memory apparatus and a signal outputted from the semiconductor memory apparatus have the same phase.

Such a DLL circuit is a clock generation device for compensating a skew between an external clock and data or between an external clock and an internal clock, and is used in a synchronous semiconductor memory apparatus.

SUMMARY

As a semiconductor memory apparatus operates at a high speed with low power consumption, there exists a need for reducing the power consumed by a DLL circuit. It should be understood that some aspects of the invention may not necessarily obviate all of the problems or disadvantages mentioned above.

To attain the advantages and in accordance with the purpose of the invention, as embodied and broadly described herein, one aspect of the invention may provide a delay locked loop circuit comprising: an input correction unit configured to correct a duty ratio of an input clock based on a duty control signal and generate a reference clock; a delay line configured to delay the reference clock by a delay time and generate a delay locked clock; an output correction unit configured to correct a duty ratio of the delay locked clock based on the duty control signal and generate a corrected clock; and a control signal generation unit configured to generate the duty control signal when a correction activation signal is enabled.

In another exemplary aspect of the invention, a delay locked loop circuit of a semiconductor memory apparatus may comprise: a delay locked clock generation block configured to detect a phase difference between a reference clock and a feedback clock, delay the reference clock by a delay value of a delay line, and generate a delay locked clock; a correction control block configured to correct the delay locked clock in response to a duty control signal, output the corrected delay locked clock as the corrected clock, and generate the duty control signal by detecting a duty ratio of the corrected clock; and an activation control unit configured to deactivate the correction control block when the phase difference between the reference clock and the feedback clock is within a preset phase difference range.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
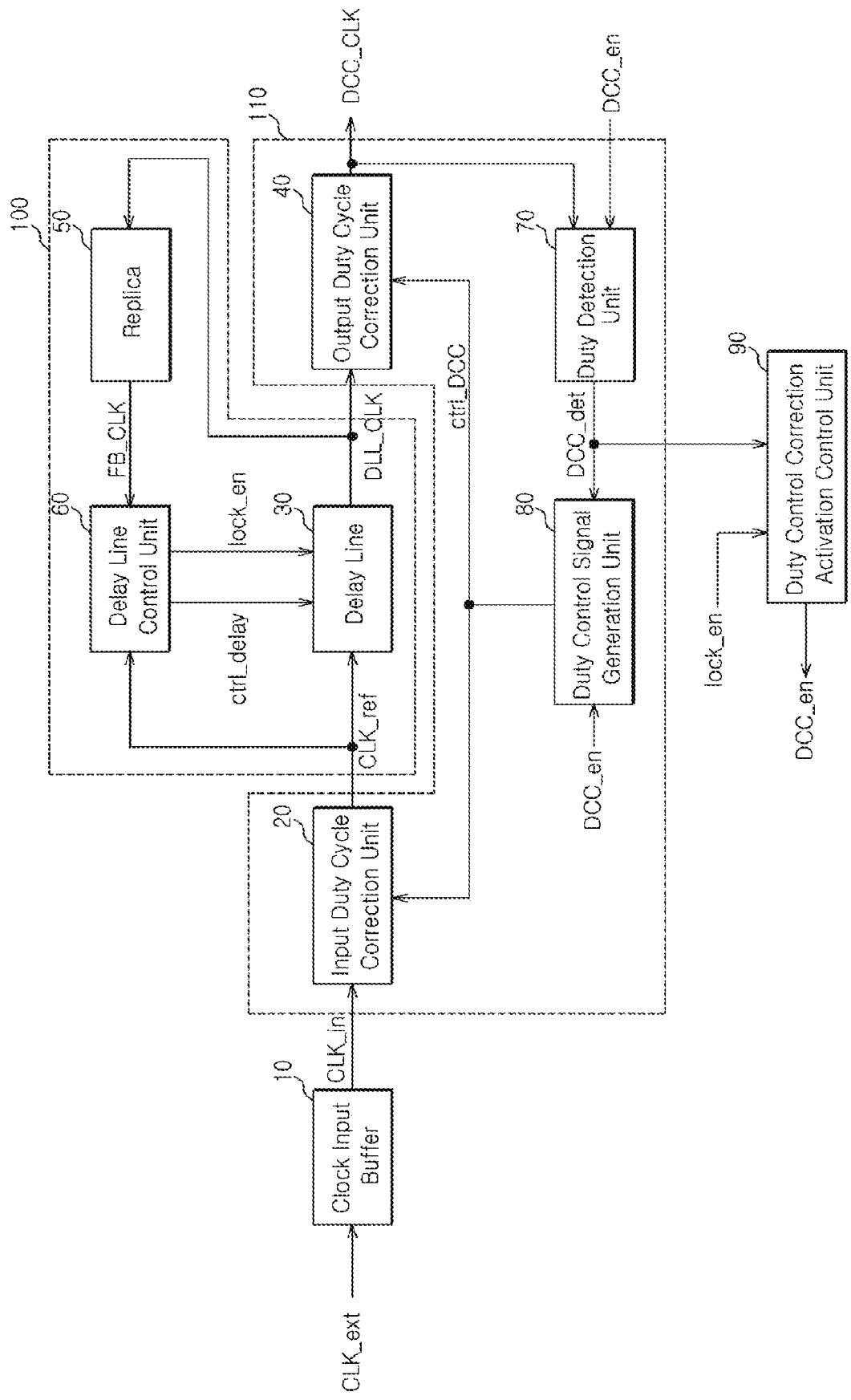
FIG. 1 is a schematic diagram illustrating a configuration of a DLL circuit of a semiconductor memory apparatus in accordance with one exemplary embodiment.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 illustrates a configuration of a DLL circuit of a semiconductor memory apparatus in accordance with one exemplary embodiment of the invention. The DLL circuit may include a clock input buffer 10, an input duty cycle correction unit 20, a delay line 30, an output duty cycle correction unit 40, a replica 50, a delay line control unit 60, a duty detection unit 70, a duty control signal generation unit 80, and a duty cycle correction activation control unit 90.

The clock input buffer 10 is configured to buffer an external clock CLK_ext and generate an input clock CLK_in.

The input duty cycle correction unit 20 is configured to correct the duty ratio of the input clock CLK_in according to a duty control signal ctrl_DCC and generate a reference clock CLK_ref.

The delay line 30 is configured to generate a delay locked clock DLL_CLK by delaying the reference clock CLK_ref by a delay time based on a delay control signal ctrl_delay, and lock the delay time in response to a lock enable signal lock_en.

The output duty cycle correction unit 40 is configured to correct the duty ratio of the delay locked clock DLL_CLK based on the duty control signal ctrl_DCC, and generate a corrected clock DCC_CLK.

The replica 50 is configured to delay the delay locked clock DLL_CLK by a predetermined delay time and output a feedback clock FB_CLK.

The delay line control unit 60 is configured to compare the phases of the feedback clock FB_CLK and the reference clock CLK_ref and generate the delay control signal ctrl_delay and the lock enable signal lock_en. The delay line control unit 60 enables the lock enable signal lock_en when a phase difference between the reference clock CLK_ref and the feedback clock FB_CLK is within a predetermined phase difference range.

The duty detection unit 70 is configured to detect the duty ratio of the corrected clock DCC_CLK when a duty cycle correction activation signal DCC_en is enabled and generate a duty detection signal DCC_det.

The duty control signal generation unit 80 is configured to generate the duty control signal ctrl_DCC in response to the duty detection signal DCC_det when the duty cycle correction activation signal DCC_en is enabled.

The duty cycle correction activation control unit 90 is configured to generate the duty cycle correction activation signal DCC_en in response to the lock enable signal lock_en and the duty detection signal DCC_det. For example, the duty cycle correction activation control unit 90 disables the duty cycle correction activation signal DCC_en when the voltage level of the duty detection signal DCC_det changes (e.g., from a high level to a low level or from a low level to a high level) after the lock enable signal lock_en is enabled. The duty cycle correction activation control unit 90 enables the duty cycle correction activation signal DCC_en when the lock enable signal lock_en is disabled.

More specifically, the duty cycle correction activation control unit 90 compares the level of the duty detection signal DCC_det at two different timings: (1) when the input clock CLK_in transitions for the first time after the lock enable signal lock_en is enabled; and (2) when the input clock CLK_in transitions for the second time. The duty cycle correction activation control unit 90 then generates the duty cycle correction activation signal DCC_en based on the comparison results.

The delay line 30, the replica 50, and the delay line control unit 60 may constitute a delay locked clock generation block 100. The delay locked clock generation block 100 detects a phase difference between the reference clock CLK_ref and the feedback clock FB_CLK, determines the delay value (or time) of the delay line 30, delays the reference clock CLK_ref by the delay value of the delay line 30, and generates the delay locked clock DLL_CLK.

The delay line 30 may include a coarse delay line (not shown) and a fine delay line (not shown), and the lock enable signal lock_en may be a signal for locking the delay time (or value) of the coarse delay line.

While the delay control signal ctrl_delay is described as one signal for the sake of convenience in explanation, it is to be noted that the delay control signal ctrl_delay, as a signal for determining the delay time of the delay line 30, may comprises a plurality of signals for respectively controlling the delay times of the coarse delay line and the fine delay line.

The input duty cycle correction unit 20, the output duty cycle correction unit 40, the duty detection unit 70 and the duty control signal generation unit 80 may constitute a duty cycle correction control block 110. The duty cycle correction control block 110 may generate the duty control signal ctrl_DCC by detecting the duty ratio of the corrected clock DCC_CLK, corrects the duty ratio of the delay locked clock DLL_CLK in response to the duty control signal ctrl_DCC, and outputs the delay locked clock DLL_CLK corrected in the duty ratio thereof as the corrected clock DCC_CLK.

While the correction control signal ctrl_DCC is described as one signal for the sake of convenience in explanation, it is to be noted that the correction control signal ctrl_DCC, as a control signal for correcting the duty ratios of the input clock CLK_in and the delay locked clock DLL_CLK, may comprise a plurality of signals for respectively controlling the input duty cycle correction unit 20 and the output duty cycle correction unit 40.

Figure 2:
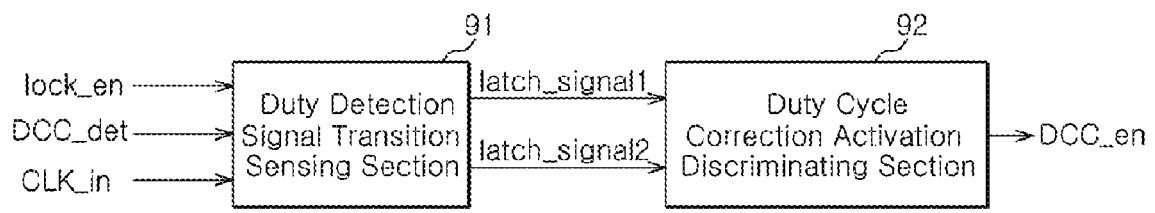
FIG. 2 is a schematic diagram illustrating an exemplary configuration of the duty cycle correction activation control unit shown in FIG. 1.

FIG. 2 illustrates an exemplary configuration of the duty cycle correction activation control unit 90 shown in FIG. 1. As shown, the duty cycle correction activation control unit 90 includes a duty detection signal transition sensing section 91 and a duty cycle correction activation discriminating section 92.

The duty detection signal transition sensing section 91 is configured to generate a first latch signal latch_signal1 by latching the duty detection signal DCC_det when the input clock CLK_in transitions for the first time to a low level after the lock enable signal lock_en is enabled, and generate a second latch signal latch_signal2 by latching the duty detection signal DCC_det when the input clock CLK_in transitions for the second time to the low level.

The duty detection signal transition sensing section 91 generates the first and second latch signals latch_signal1 and latch_signal2 of the same level regardless of the input clock CLK_in when the lock enable signal lock_en is disabled. For example, the duty detection signal transition sensing section 91 generates the first and second latch signals latch_signal1 and latch_signal2 with the same voltage level as the duty detection signal DCC_det when the lock enable signal lock_en is disabled.

The duty cycle correction activation discriminating section 92 is configured to enable the duty cycle correction activation signal DCC_en when the levels of the first latch signal latch_signal1 and the second latch signal latch_signal2 are the same, and disable the duty cycle correction activation signal DCC_en when the levels of the first latch signal latch_signal1 and the second latch signal latch_signal2 are different from each other.

Figure 3:
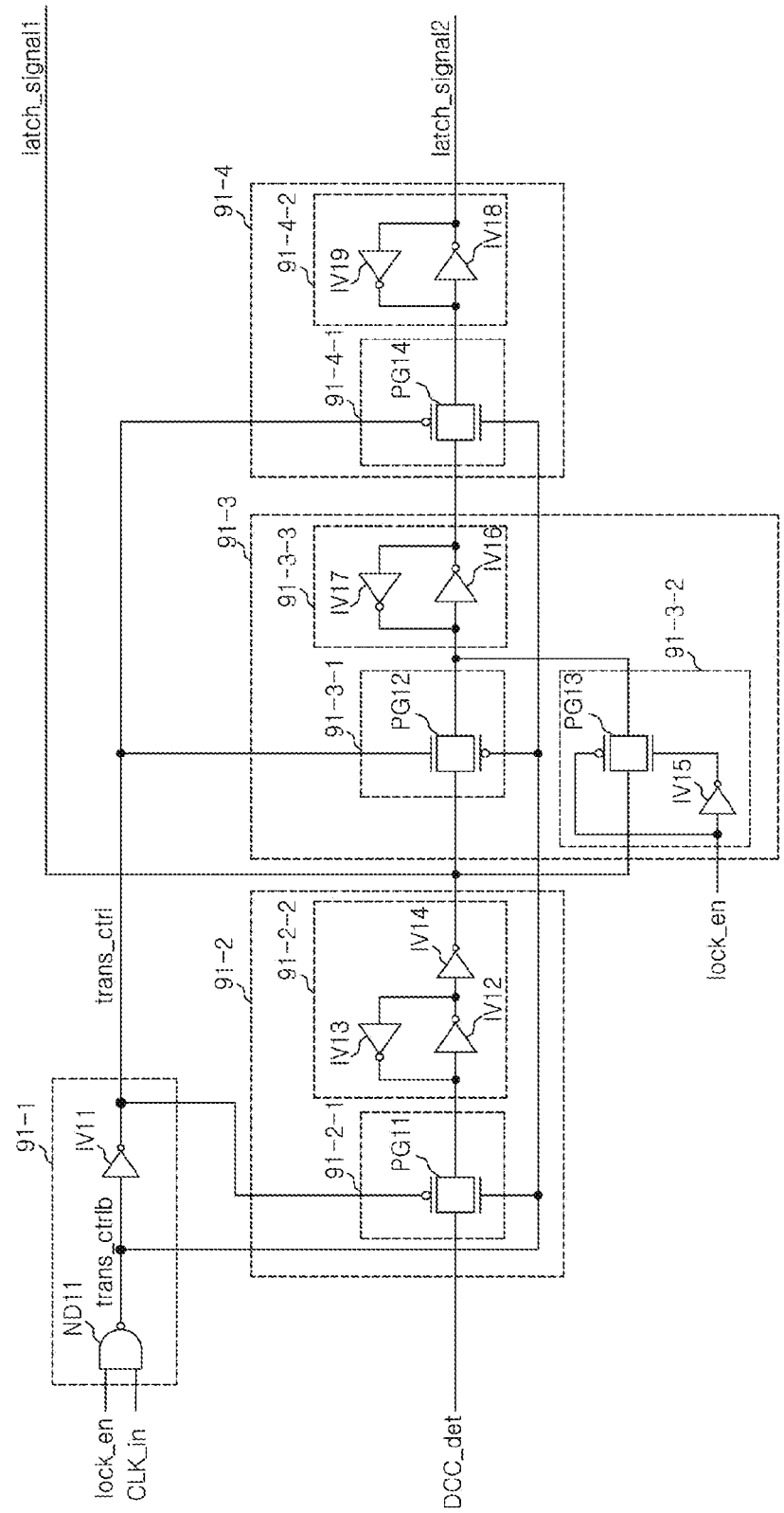
FIG. 3 is a schematic diagram illustrating an exemplary configuration of the duty detection signal transition sensing section shown in FIG. 2.

FIG. 3 illustrates an exemplary configuration of the duty detection signal transition sensing section 91 shown in FIG. 2. As shown, the duty detection signal transition sensing section 91 may include a transfer control signal generation stage 91-1, a first latch control stage 91-2, a second latch control stage 91-3, and a third latch control stage 91-4.

The transfer control signal generation stage 91-1 is configured to output the input clock CLK_in as a transfer control signal trans_ctrl when the lock enable signal lock_en is enabled and lock the transfer control signal trans_ctrl to a low level when the lock enable signal lock_en is disabled.

The transfer control signal generation stage 91-1 includes a first NAND gate ND11 and a first inverter IV11. The first NAND gate ND11 receives the lock enable signal lock_en and the input clock CLK_in. The first inverter IV11 inverts the output signal of the first NAND gate ND11 and outputs the transfer control signal trans_ctrl. The output signal of the first NAND gate ND11 is referred to as an inverted transfer control signal trans_ctrlb.

The first latch control stage 91-2 is configured to receive and latch the duty detection signal DCC_det and generate the first latch signal latch_signal1 when the transfer control signal trans_ctrl has the low level.

The first latch control stage 91-2 may include a first switch 91-2-1 and a first latch part 91-2-2.

The first switch 91-2-1 is configured to be turned on when the transfer control signal trans_ctrl has the low level and to transfer the duty detection signal DCC_det.

The first switch 91-2-1 may include a first pass gate PG11. The first pass gate PG11 has a first control terminal which receives the transfer control signal trans_ctrl, a second control terminal which receives the inverted transfer control signal trans_ctrlb, and an input terminal which receives the duty detection signal DCC_det.

The first latch part 91-2-2 latches the output signal of the first switch 91-2-1 and outputs the first latch signal latch_signal1. The first latch part 91-2-2 may include second through fourth inverters IV12 through IV14. The second inverter IV12 has an input terminal to which the output terminal of the first pass gate PG11 is coupled. The third inverter IV13 has an input terminal which is coupled to the output terminal of the second inverter IV12 and an output terminal which is coupled to the input terminal of the second inverter IV12. The fourth inverter IV14 inverts the output signal of the second inverter IV12 and outputs the first latch signal latch_signal1.

The second latch control stage 91-3 is configured to receive and latch the first latch signal latch_signal1 when the transfer control signal trans_ctrl has a high level or receive and latch the first latch signal latch_signal1 when the lock enable signal lock_en is disabled.

The second latch control stage 91-3 may include second and third switches 91-3-1 and 91-3-2 and a second latch part 91-3-3.

The second switch 91-3-1 may be configured to be turned on when the transfer control signal trans_ctrl has the high level and to transfer the first latch signal latch_signal1. The second switch 91-3-1 may include a second pass gate PG12. The second pass gate PG12 has a first control terminal which receives the transfer control signal trans_ctrl, a second control terminal which receives the inverted transfer control signal trans_ctrlb, and an input terminal which receives the first latch signal latch_signal1.

The third switch 91-3-2 may include a third pass gate PG13 and a fifth inverter IV15. The fifth inverter IV15 receives the lock enable signal lock_en. The third pass gate PG13 has a first control terminal which receives the lock enable signal lock_en, a second control terminal which receives the output signal of the fifth inverter IV15, and an input terminal which receives the first latch signal latch_signal1.

The second latch part 91-3-3 receives and latches the signal of a node to which the output terminals of the second pass gate PG12 and the third pass gate PG13 are commonly coupled. The second latch part 91-3-3 may include sixth and seventh inverters IV16 and IV17. The sixth inverter IV16 has an input terminal to which the node coupled commonly with the output terminals of the second pass gate PG12 and the third pass gate PG13 is coupled. The seventh inverter IV17 has an input terminal to which the output terminal of the sixth inverter IV16 is coupled and an output terminal which is coupled to the input terminal of the sixth inverter IV16.

The third latch control stage 91-4 is configured to receive and latch the output signal of the second latch control stage 91-3 when the transfer control signal trans_ctrl has the low level and output the second latch signal latch_signal2. The third latch control stage 91-4 may include a fourth switch 91-4-1 an third latch part 91-4-2.

The fourth switch 91-4-1 may be configured to be turned on when the transfer control signal trans_ctrl has the low level and transfer the output signal of the second latch control stage 91-3. The fourth switch 91-4-1 may include a fourth pass gate PG14. The fourth pass gate PG14 has a first control terminal which receives the transfer control signal trans_ctrl, a second control terminal which receives the inverted transfer control signal trans_ctrlb, and an input terminal which receives the output signal of the second latch part 91-3-3.

The third latch part 91-4-2 latches the output signal of the fourth switch 91-4-1 and outputs the second latch signal latch_signal2. The third latch part 91-4-2 may include eighth and ninth inverters IV18 and IV19. The eighth inverter IV18 receives the output signal of the fourth switch 91-4-1 through the input terminal thereof, and outputs the second latch signal latch_signal2. The ninth inverter IV19 has an input terminal to which the output terminal of the eighth inverter IV18 is coupled and an output terminal which is coupled to the input terminal of the eighth inverter IV18.

Figure 4:
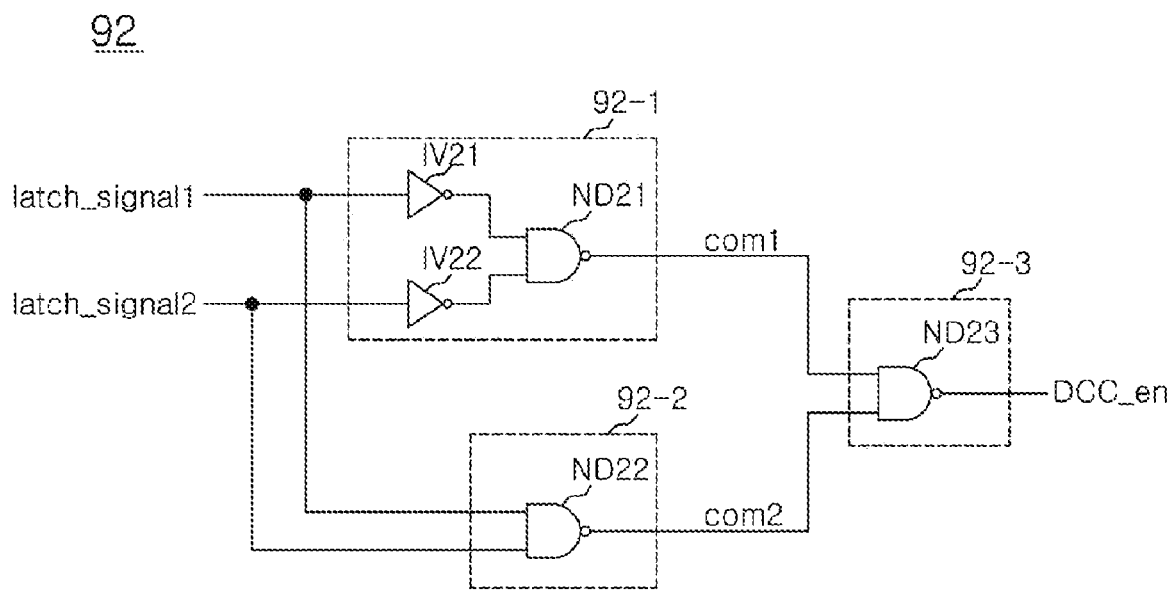
FIG. 4 is a schematic diagram illustrating an exemplary configuration of the duty cycle correction activation discriminating section shown in FIG. 2.

FIG. 4 illustrates an exemplary configuration of the duty cycle correction activation discriminating section 92 shown in FIG. 2. As shown in FIG. 4, the duty cycle correction activation discriminating section 92 may include a first signal comparison stage 92-1, a second signal comparison stage 92-2, and a signal combination stage 92-3.

The first signal comparison stage 92-1 is configured to enable a first comparison signal com1 when both the first and second latch signals latch_signal1 and latch_signal2 have high levels.

The first signal comparison stage 92-1 may include tenth and eleventh inverters IV21 and IV22 and a second NAND gate ND21. The tenth inverter IV21 receives the first latch signal latch_signal1. The eleventh inverter IV22 receives the second latch signal latch_signal2. The second NAND gate ND21 receives the output signals of the tenth and eleventh inverters IV21 and IV22 and outputs the first comparison signal com1.

The second signal comparison stage 92-2 is configured to enable a second comparison signal com2 when both the first and second latch signals latch_signal1 and latch_signal2 have low levels.

The second signal comparison stage 92-2 may include a third NAND gate ND22. The third NAND gate ND22 receives the first and second latch signals latch_signal1 and latch_signal2 and outputs the second comparison signal com2.

The signal combination stage 92-3 is configured to enable the duty cycle correction activation signal DCC_en when one of the first comparison signal com1 and the second comparison signal com2 is enabled, and disable the duty cycle correction activation signal DCC_en when both the first comparison signal com1 and the second comparison signal com2 are disabled.

The signal combination stage 92-3 may include a fourth NAND gate ND23. The fourth NAND gate ND23 receives the first and second comparison signals com1 and com2 and outputs the duty cycle correction activation signal DCC_en.

Figure 5:
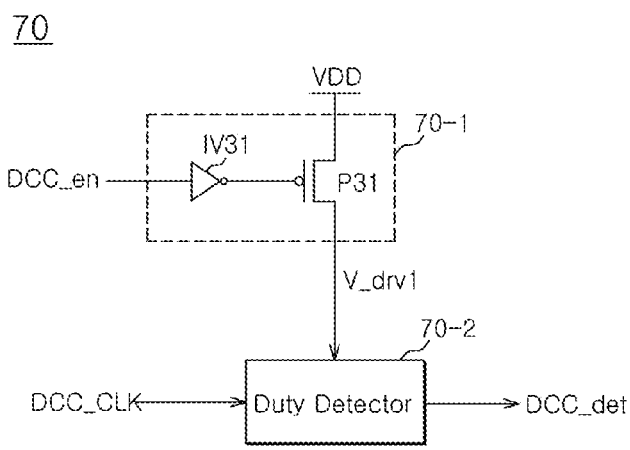
FIG. 5 is a schematic diagram illustrating an exemplary configuration of the duty sensing unit shown in FIG. 1.

FIG. 5 illustrates an exemplary configuration of the duty sensing unit 70 shown in FIG. 1. As shown, the duty detection unit 70 may include a first driving voltage output section 70-1 and a duty detector 70-2. The first driving voltage output section is configured to output an external voltage VDD as a first driving voltage V_drv1 when the duty cycle correction activation signal DCC_en is enabled. The duty detector 70-2 is configured to receive the first driving voltage V_drv1, compare the high level duration and the low level duration of the corrected clock DCC_CLK, and generate the duty detection signal DCC_det.

The first driving voltage output section 70-1 may include a twelfth inverter IV31 and a first transistor P31. The twelfth inverter IV31 receives the duty cycle correction activation signal DCC_en. The first transistor P31 has a gate which receives the output signal of the twelfth inverter IV31, a source which receives the external voltage VDD, and a drain which outputs the first driving voltage V_drv1.

The duty detector 70-2 may be a duty ratio detection circuit known in the art. The duty detector 70-2 detects the duty ratio (e.g., a size ratio between the high level duration and the low level duration) of the clock inputted thereto and outputs a detection result as the output signal thereof.

In the disclosed embodiment, the duty detector 70-2 receives the corrected clock DCC_CLK. Therefore, the duty detector 70-2 compares the high level duration and the low level duration of the corrected clock DCC_CLK and outputs a comparison result as the duty detection signal DCC_det.

While the duty detection signal DCC_det is described as one signal for the sake of convenience in explanation, it is to be noted that the duty detection signal DCC_det may comprise a plurality of signals.

The duty detector 70-2 may perform an operation of detecting the duty ratio of the corrected clock DCC_CLK when the duty detector 70-2 is activated by receiving the first driving voltage V_drv1 and may not perform the operation of detecting the duty ratio of the corrected clock DCC_CLK when the duty detector 70-2 is deactivated by not receiving the first driving voltage V_drv1.

Figure 6:
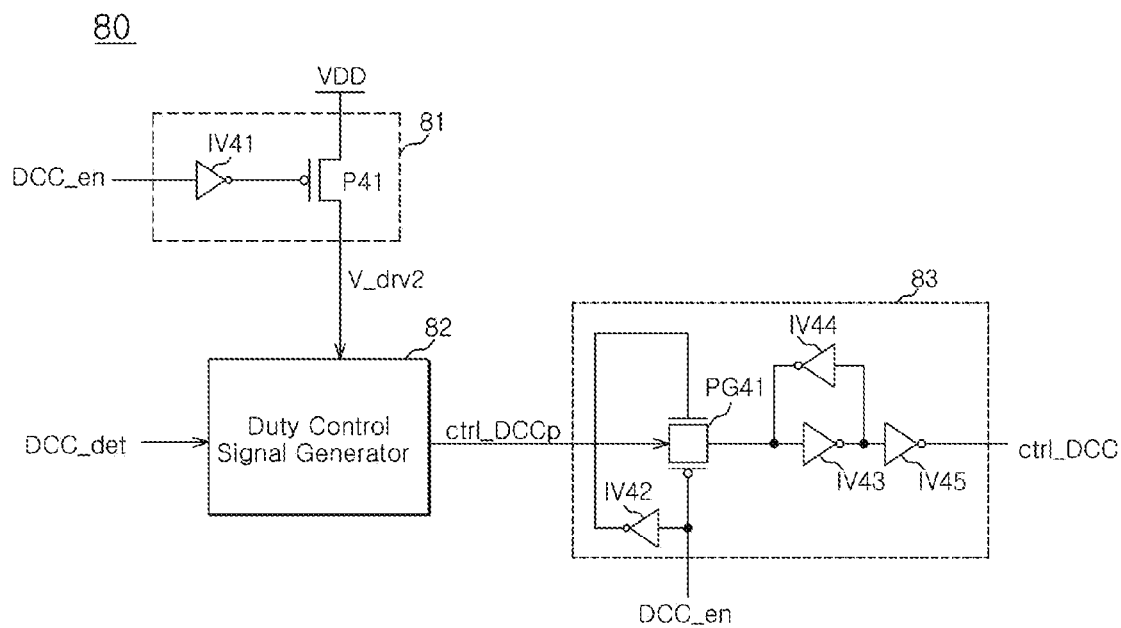
FIG. 6 is a schematic diagram illustrating an exemplary configuration of the duty control signal generation unit shown in FIG. 1.

FIG. 6 illustrates an exemplary configuration of the duty control signal generation unit 80 shown in FIG. 1. As shown in FIG. 6, the duty control signal generation unit 80 may include a second driving voltage output section 81, a duty control signal generator 82, and a fourth latch part 83.

The second driving voltage output section 81 is configured to output the external voltage VDD as a second driving voltage V_drv2 when the duty cycle correction activation signal DCC_en is enabled.

The second driving voltage output section 81 may include a thirteenth inverter IV41 and a second transistor P41. The thirteenth inverter IV41 receives the duty cycle correction activation signal DCC_en. The second transistor P41 has a gate which receives the output signal of the thirteenth inverter IV41, a source which receives the external voltage VDD, and a drain which outputs the second driving voltage V_drv2.

The duty control signal generator 82 outputs information regarding whether to increase or decrease the high level duration of the clock according to information acquired by detecting a duty ratio in a duty cycle correction circuit which is generally known in the art. The duty control signal generator 82 outputs information regarding whether to increase or decrease the high level duration of the corrected clock DCC_CLK according to the duty detection signal DCC_det, as a preliminary duty control signal ctrl_DCCp.

When the duty control signal generator 82 is activated by receiving the second driving voltage V_drv2, the duty control signal generator 82 generates the preliminary duty control signal ctrl_DCCp in response to the duty detection signal DCC_det. The preliminary duty control signal ctrl_DCCp includes information regarding whether to increase or decrease a specified duration of the corrected clock DCC_CLK.

While the preliminary duty control signal ctrl_DCCp is described as one signal for the sake of convenience in explanation, it is to be noted that the preliminary duty control signal ctrl_DCCp may comprise a plurality of signals.

The fourth latch part 83 is configured to output the duty control signal ctrl_DCC by latching the preliminary duty control signal ctrl_DCCp when the duty cycle correction activation signal DCC_en is enabled and maintain and output the latched duty control signal ctrl_DCC regardless of the preliminary duty control signal ctrl_DCCp when the duty cycle correction activation signal DCC_en is disabled. If the preliminary duty control signal ctrl_DCCp is a plurality of signals, the fourth latch part 83 is provided in the same number as the number of the signals of the preliminary duty control signal ctrl_DCCp.

The fourth latch part 83 may include fourteenth through seventeenth inverters IV42 through IV45 and a fifth pass gate PG41. The fourteenth inverter IV42 receives the duty cycle correction activation signal DCC_en. The fifth pass gate PG41 has a first control terminal which receives the output signal of the fourteenth inverter IV42, a second control terminal which receives the duty cycle correction activation signal DCC_en, and an input terminal which receives the preliminary duty control signal ctrl_DCCp. The fifteenth inverter IV43 has an input terminal to which the output terminal of the fifth pass gate PG41 is coupled. The sixteenth inverter IV144 has an input terminal to which the output terminal of the fifteenth inverter IV43 is coupled and an output terminal which is coupled to the input terminal of the fifteenth inverter IV43. The seventeenth inverter IV45 inverts the output signal of the fifteenth inverter IV43 and outputs the duty control signal ctrl_DCC.

Some exemplary operations of the DLL circuit of a semiconductor memory apparatus, consistent with various aspects of the invention, will be described in detail below.

Referring to FIG. 1, the clock input buffer 10 buffers the external clock CLK_ext and generates the input clock CLK_in. The input duty cycle correction unit 20 corrects the duty ratio of the input clock CLK_in in response to the duty control signal ctrl_DCC and outputs the reference clock CLK_ref.

The delay line 30 changes its delay time in response to the delay control signal ctrl_delay. The delay line 30 delays the reference clock CLK_ref by the delay time according to the delay control signal ctrl_delay and generates the delay locked clock DLL_CLK.

The replica 50 delays the delay locked clock DLL_CLK by a predetermined delay time and generates the feedback clock FB_CLK.

The delay line control unit 60 detects the phase difference between the reference clock CLK_ref and the feedback clock FB_CLK and generates the delay control signal ctrl_delay. The delay line control unit 60 enables the lock enable signal lock_en when the phase difference between the reference clock CLK_ref and the feedback clock FB_CLK is within a predetermined phase difference range. If the lock enable signal lock_en is enabled, the delay time of the delay line 30 is locked.

The output duty cycle correction unit 40 corrects the duty ratio of the delay locked clock DLL_CLK in response to the duty control signal ctrl_DCC and generates the corrected clock DCC_CLK.

The duty detection unit 70 detects the duty ratio of the corrected clock DCC_CLK when the duty cycle correction activation signal DCC_en is enabled and generates the duty detection signal DCC_det. The duty detection signal DCC_det may be a signal which becomes a high level when the high level duration of the corrected clock DCC_CLK is longer than the low level duration of the corrected clock DCC_CLK and becomes a low level when the high level duration of the corrected clock DCC_CLK is shorter than the low level duration of the corrected clock DCC_CLK.

The duty control signal generation unit 80 generates the duty control signal ctrl_DCC in response to the duty detection signal DCC_det when the duty cycle correction activation signal DCC_en is enabled.

The duty cycle correction activation control unit 90 enables the duty cycle correction activation signal DCC_en when the level of the duty detection signal DCC_det changes after the lock enable signal lock_en is enabled. The duty cycle correction activation control unit 90 disables the duty cycle correction activation signal DCC_en when the lock enable signal lock_en is disabled.

Operations of the duty cycle correction activation control unit 90 will be described below in detail with reference to FIGS. 3 and 4.

When the lock enable signal lock_en is enabled to a high level, the input clock CLK_in is outputted as the transfer control signal trans_ctrl.

If the transfer control signal trans_ctrl transitions for the first time to the low level after the lock enable signal lock_en is enabled, the first switch 91-2-1 is turned on, and the duty detection signal DCC_det is stored in the first latch part 91-2-2.

If the transfer control signal trans_ctrl transitions to the high level, the second switch 91-3-1 is turned on, and the signal latched by the first latch part 91-2-2 is transferred to the second latch part 91-3-3.

If the transfer control signal trans_ctrl transitions for a second time to the low level, the first and third switches 91-2-1 and 91-4-1 are turned on. Accordingly, the first latch part 91-2-2 latches the duty detection signal DCC_det, and the third latch part 91-4-2 latches the signal which is latched by the second latch part 91-3-3. At this time, the output signal of the first latch part 91-2-2 is outputted as the first latch signal latch_signal1, and the output signal of the third latch part 91-4-2 is outputted as the second latch signal latch_signal2.

Thus, the levels of the first latch signal latch_signal1 and the second latch signal latch_signal2 are the levels of the duty detection signal DCC_det which have a time difference corresponding to one cycle of the input clock CLK_in. By comparing the levels of the first latch signal latch_signal1 and the second latch signal latch_signal2, it is possible to check whether the level of the duty detection signal DCC_det is changed or not.

Therefore, as shown in FIG. 4, if the levels of the first and second latch signals latch_signal1 and latch_signal2 are the same with each other, the levels of the first and second comparison signals com1 and com2 become different from each other. If the levels of the first and second comparison signals com1 and com2 are different from each other, the duty cycle correction activation signal DCC_en which is activated to a high level is generated. Also, if the levels of the first and second latch signals latch_signal1 and latch_signal2 are different from each other, both the first and second comparison signals com1 and com2 become high levels. If both the first and second comparison signals com1 and com2 become the high levels, the duty cycle correction activation signal DCC_en is disabled to a low level.

As a result, the duty cycle correction activation signal DCC_en is enabled if the level of the duty detection signal DCC_det is not changed after the lock enable signal lock_en is enabled, and the duty cycle correction activation signal DCC_en is disabled if the level of the duty detection signal DCC_det is changed after the lock enable signal lock_en is enabled.

Referring to FIG. 3, if the lock enable signal lock_en is disabled to a low level, the transfer control signal trans_ctrl is locked to the low level, and the first switch 91-2-1, the third switch 91-3-2, and the fourth switch 91-4-1 are all turned on. As a result, the duty detection signal DCC_det and the first and second latch signals latch_signal1 and latch_signal2 become the same levels. If the first and second latch signals latch_signal1 and latch_signal2 become the same levels, the duty cycle correction activation signal DCC_en is enabled.

Referring to FIGS. 5 and 6, the duty detection unit 70 and the duty control signal generation unit 80 receive the respective driving voltages V_drv1 and V_drv2 for activation and operation when the duty cycle correction activation signal DCC_en is enabled. The duty control signal generation unit 80 maintains and outputs the level of the duty control signal ctrl_DCC outputted by the fourth latch part 83 even though the duty cycle correction activation signal DCC_en is disabled and deactivated.

Thus, if the duty ratio of the delay locked clock DLL_CLK becomes the same (e.g., if the level of the duty detection signal DCC_det is changed) after the delay time of the delay line 30 is determined to be within a predetermined range, the relevant circuits for correcting the duty ratio of the delay locked clock DLL_CLK (e.g., duty detection unit 70, duty control signal generation unit 80, etc.) are deactivated. Also, as the duty control signal ctrl_DCC is locked, the duty ratio can be kept locked in the input duty cycle correction unit 20 and the output duty cycle correction unit 40, whereby current consumption due to a change in the duty ratio can be prevented.

As is apparent from the above disclosure, in a DLL circuit constructed and/or operated consistent with the present disclosure power consumption of the circuits used for duty correction (such as input duty cycle correction unit 20, output duty cycle correction unit 40, duty detection unit 70, and duty control signal generation unit 80 of the disclosed embodiments) can be reduced.

While certain embodiments have been described above, it will be understood to those skilled in the art that the embodiments described are by way of example only. Accordingly, the circuit of a semiconductor memory apparatus described herein should not be limited based on the described embodiments. Rather, the circuit of a semiconductor memory apparatus described herein should only be limited in light of the claims that follow when taken in conjunction with the above description and accompanying drawings.

What is claimed is:

1. A delay locked loop circuit of a semiconductor memory apparatus, comprising:
   an input correction unit configured to correct a duty ratio of an input clock based on a duty control signal and generate a reference clock;
   a delay line configured to delay the reference clock by a delay time and generate a delay locked clock;
   an output correction unit configured to correct a duty ratio of the delay locked clock based on the duty control signal and generate a corrected clock;
   a control signal generation unit configured to generate the duty control signal when a correction activation signal is enabled.

2. The delay locked loop circuit according to claim 1, wherein the delay line is configured to delay the reference clock based on a delay control signal and lock the delay time in response to a lock enable signal.

3. The delay locked loop circuit according to claim 2, further comprising:
   a replica configured to delay the delay locked clock by a predetermined delay time and output a feedback clock; and
   a delay line control unit configured to compare phases of the feedback clock and the reference clock and generate the delay control signal and the lock enable signal.

4. The delay locked loop circuit according to claim 3, further comprising a detection unit configured to detect a duty ratio of the corrected clock when a correction activation signal is enabled and generate a duty detection signal.

5. The delay locked loop circuit according to claim 4, further comprising an activation control unit configured to generate the correction activation signal in response to the lock enable signal and the duty detection signal.

6. The delay locked loop circuit according to claim 5, wherein the activation control unit is configured to disable the correction activation signal when a voltage level of the duty detection signal is changed after the lock enable signal is enabled.

7. The delay locked loop circuit according to claim 6, wherein the activation control unit is configured to enable the correction activation signal when the lock enable signal is disabled.

8. The delay locked loop circuit according to claim 6, wherein the activation control unit is configured to disable the correction activation signal when the duty detection signal transitions from a high level to a low level or from a low level to a high level after the lock enable signal is enabled.

9. The delay locked loop circuit according to claim 8, wherein the activation control unit is configured to generate the correction activation signal by comparing a level of the duty detection signal when the input clock transitions for a first time after the lock enable signal is enabled and a level of the duty detection signal when the input clock transitions for a second time.

10. The delay locked loop circuit according to claim 9, wherein the activation control unit comprises:
   a sensing section configured to generate a first latch signal by latching the duty detection signal when the input clock transitions for a first time after the lock enable signal is enabled, and generate a second latch signal by latching the duty detection signal when the input clock transitions for a second time; and
   a discriminating section configured to enable the correction activation signal when levels of the first latch signal and the second latch signal are substantially the same with each other, and disable the correction activation signal when the levels of the first latch signal and the second latch signal are different from each other.

11. The delay locked loop circuit according to claim 10, wherein the sensing section is configured such that the levels of the first and second latch signals become the same with each other regardless of the input clock when the lock enable signal is disabled.

12. The delay locked loop circuit according to claim 10, wherein the discriminating section comprises:
   a first signal comparison stage configured to enable a first comparison signal when both the first and second latch signals have high levels;
   a second signal comparison stage configured to enable a second comparison signal when both the first and second latch signals have low levels; and
   a signal combination stage configured to enable the correction activation signal when one of the first comparison signal and the second comparison signal is enabled, and disable the correction activation signal when both the first comparison signal and the second comparison signal are disabled.

13. The delay locked loop circuit according to claim 4, wherein the detection unit comprises:
   a driving voltage output section configured to output an external voltage as a driving voltage when the correction activation signal is enabled; and
   a duty detector configured to receive the driving voltage, compare a high level duration and a low level duration of the corrected clock, and generate the duty detection signal.

14. The delay locked loop circuit according to claim 1, wherein the control signal generation unit comprises:
   a driving voltage output section configured to output an external voltage as a driving voltage when the correction activation signal is enabled;
   a duty control signal generator configured to receive the driving voltage and generate a preliminary duty control signal in response to the duty detection signal; and
   a latch part configured to output the duty control signal by latching the preliminary duty control signal when the correction activation signal is enabled, and maintain and output the latched duty control signal regardless of the preliminary duty control signal when the correction activation signal is disabled.

15. A delay locked loop circuit of a semiconductor memory apparatus, comprising:
   a delay locked clock generation block configured to detect a phase difference between a reference clock and a feedback clock, delay the reference clock by a delay value of a delay line, and generate a delay locked clock;
   a correction control block configured to correct the delay locked clock in response to a duty control signal, output the corrected delay locked clock as the corrected clock, and generate the duty control signal by detecting a duty ratio of the corrected clock; and
   an activation control unit configured to receive a lock enable signal and a duty detection signal, and deactivate the correction control block when the phase difference between the reference clock and the feedback clock is within a preset phase difference range.

16. The delay locked loop circuit according to claim 15, wherein the correction control block is configured to generate and latch the duty control signal by detecting the duty ratio of the corrected clock when a correction activation signal is enabled, and outputs the corrected clock by correcting the duty ratio of the delay locked clock based on the duty control signal, and wherein the correction control block outputs the latched duty control signal when the correction activation signal is disabled.

17. The delay locked loop circuit according to claim 16, wherein the correction control block comprises:
   an output correction unit configured to correct the duty ratio of the delay locked clock based on the duty control signal and generate the corrected clock;
   a detection unit configured to detect the duty ratio of the corrected clock when the correction activation signal is enabled, and generate the duty detection signal; and
   a control signal generation unit configured to generate the duty control signal in response to the duty detection signal when the correction activation signal is enabled.

18. The delay locked loop circuit according to claim 17, wherein the detection unit comprises:
   a driving voltage output section configured to output an external voltage as a driving voltage when the correction activation signal is enabled; and
   a duty detector configured to receive the driving voltage, compare a high level duration and a low level duration of the corrected clock, and generate the duty detection signal.

19. The delay locked loop circuit according to claim 17, wherein the control signal generation unit control signal generation unit comprises:

a driving voltage output section configured to output an external voltage as a driving voltage when the correction activation signal is enabled;

a duty control signal generator configured to receive the driving voltage and generate a preliminary duty control signal in response to the duty detection signal; and a latch part configured to output the duty control signal by latching the preliminary duty control signal when the correction activation signal is enabled, and maintain and output the latched duty control signal regardless of the preliminary duty control signal when the correction activation signal is disabled.

20. The delay locked loop circuit according to claim 15, wherein the delay locked clock generation block is configured to generate the lock enable signal which locks the delay time of the delay line, when the phase difference between the reference clock and the feedback clock is within the preset phase difference range.

21. The delay locked loop circuit according to claim 20, wherein the activation control unit is configured to disable the correction activation signal when the duty detection signal transitions after the lock enable signal is enabled.

22. The delay locked loop circuit according to claim 21, wherein the activation control unit is configured to enable the correction activation signal when the lock enable signal is disabled.

23. The delay locked loop circuit according to claim 22, wherein the activation control unit is configured to generate the correction activation signal by comparing a level of the duty detection signal when a clock transitions for a first time after the lock enable signal is enabled and a level of the duty detection signal when the clock transitions for a second time.

24. The delay locked loop circuit according to claim 23, wherein the activation control unit comprises:

a sensing section configured to generate a first latch signal by latching the duty detection signal when the clock transitions first after the lock enable signal is enabled, and generate a second latch signal by latching the duty detection signal when the clock transitions second; and a discriminating section configured to enable the correction activation signal when levels of the first latch signal and the second latch signal are the same with each other, and disable the correction activation signal when the levels of the first latch signal and the second latch signal are different from each other.

25. The delay locked loop circuit according to claim 24, wherein the sensing section is configured such that the levels of the first and second latch signals become the same with each other regardless of the clock when the lock enable signal is disabled.

26. The delay locked loop circuit according to claim 24, wherein the discriminating section comprises:

a first signal comparison stage configured to enable a first comparison signal when both the first and second latch signals have high levels;

a second signal comparison stage configured to enable a second comparison signal when both the first and second latch signals have low levels; and a signal combination stage configured to enable the correction activation signal when one of the first comparison signal and the second comparison signal is enabled, and disable the correction activation signal when both the first comparison signal and the second comparison signal are disabled.

* * * * *